United States Patent [19]

Takakura

[11] Patent Number: 5,019,486
[45] Date of Patent: May 28, 1991

[54] METHOD FOR FORMING PLATE CHARACTERS IN A HALF-TONE GRAVURE PLATEMAKING PROCESS

[75] Inventor: Koichi Takakura, Chiba, Japan

[73] Assignee: Think Laboratory Co., Ltd., Chiba, Japan

[21] Appl. No.: 477,325

[22] Filed: Feb. 8, 1990

[30] Foreign Application Priority Data

Jul. 3, 1989 [JP] Japan .................... 1-171382

[51] Int. Cl.$^5$ ............................. G03F 7/004
[52] U.S. Cl. .................... 430/307; 430/300; 101/150; 101/170; 101/401.1
[58] Field of Search ............... 430/300, 307; 101/401.1, 150, 170

[56] References Cited

U.S. PATENT DOCUMENTS 3,804,622  4/1974  Bergin ................... 430/307
3,980,018  9/1976  Ichikawa ............... 101/401.1

Primary Examiner—Charles L. Bowers, Jr.
Assistant Examiner—Janis L. Dote
Attorney, Agent, or Firm—Koda and Androlia

[57] ABSTRACT

A method for forming plate characters in a half-tone gravure platemaking process in which a laser beam intermittently irradiates a photosensitive material, thus forming plate characters therein as a result of exposure by the laser beam. The outline portion of each character is made up of continuous groove-form cells and inner portion of the character (the filled portion) is made up of independent dot-form cells corresponding to the dot percentage of a shadow portion or with island-form projections to the extent that ink flow (running) does not occur when the cells are filled with ink as a result of the plate surface being wiped by a doctor blade. The outline portion of each character is made up of groove-form cells having a narrow width without causing ink flow (running) when the cells are filled with ink as a result of the plate surface being wiped by a doctor blade.

2 Claims, 1 Drawing Sheet

F I G. 1 (a)  F I G. 1 (b)  F I G. 1 (c)
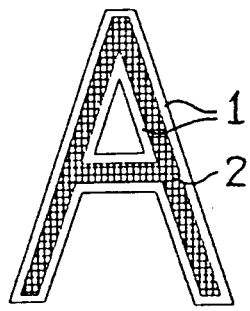 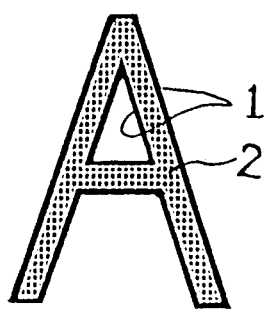 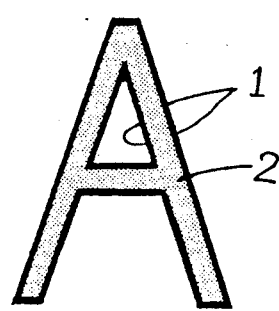
F I G. 2 (a)  F I G. 2 (b)  F I G. 2 (c)
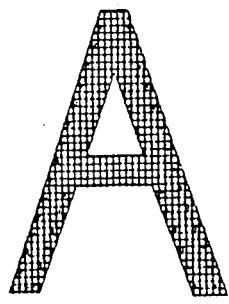 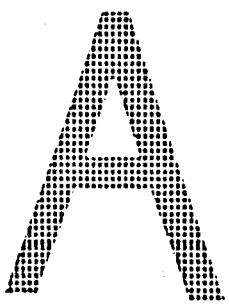 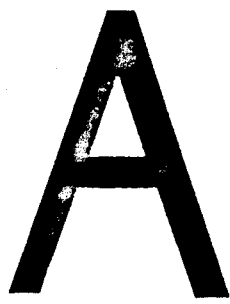

METHOD FOR FORMING PLATE CHARACTERS IN A HALF-TONE GRAVURE PLATEMAKING PROCESS

BACKGROUND OF THE INVENTION

1. Field of the Invention

The present invention relates to a method for forming plate characters in a half-tone gravure platemaking process.

2. Prior art

FIGS. 2(a) through 2(c) show a process in which a half-tone gravure character (the English letter "A" in this case) is prepared by a conventional method for forming plate characters in a half-tone gravure platemaking process, and then printed.

FIG. 2(a) shows the screened plate character "A". Here, the entire plate character consists of dot-shaped cells which are formed by etching so that they correspond to the dot percentage of the shadow portion of the character.

FIG. 2(b) illustrates a state in which ink has been transferred to the screened plate character "A" illustrated in FIG. 2(a). When this character is transfer-printed onto paper, etc., the ink spreads so that the portion of the blank paper corresponding to the screen lines disappear, thus producing an English letter "A" in which the entire body of the character is black as shown in FIG. 2(c).

Thus, in a conventional process, the plate characters are composed of dot-shaped cells which correspond to the dot percentage of the shadow portion of each character. Accordingly, the outlines of the half-tone gravure characters (printed characters) are notched, so that the quality of the printed characters is inferior to characters printed by typeface printing. This drop in quality is especially conspicuous in the case of small characters.

SUMMARY OF THE INVENTION

The present invention was devised in light of the above described problems found in the prior art. The object of the present invention is to provide a method for forming plate characters in a half-tone gravure platemaking process in which the character outline of half-tone gravure characters is as sharp as the outlines of characters obtained in typeface printing.

The object of the present invention is achieved utilizing a method in which a laser beam of a laser exposure apparatus is moved so that the laser beam (intermittently) irradiates a photosensitive material in spot-like form, thus forming plate characters in the photosensitive material as a result of exposure to the laser beam. Each plate character is formed so that (i) the outline portion of a character is formed by continuous groove-shaped cells, and (ii) the filled portion of the character (i.e., the area inside the outline portion of the character) is formed by independent dot-shaped cells corresponding to the dot percentage of the shadow portion, or by island-shaped projections to an extent which does not result in any ink flow (running) when the cells are filled with ink as a result of the plate surface being wiped by a doctor blade. The outline portion of each character is made up of groove-shaped cells which have as narrow a width as possible without causing ink flow (running) when the cells are filled with ink as a result of the plate surface being wiped by a doctor blade.

In the half-tone gravure printing plates (rolls or flat plates) of the present invention, the outline portion of each character is formed by continuous groove-shaped cells which are as narrow as possible without causing ink flow (running). The filled portion of each character is made up of dot-shaped cells corresponding to the dot percentage of the shadow portion of the character. Accordingly, each plate character as a whole, i.e., the outline portion of the character and the filled portion of the character, are satisfactorily filled with ink when the surface of the plate is wiped by a doctor blade. As a result, ink is thick in the outline portion of each printed character, so that the outline of the character is far sharper than in typeface printing. Furthermore, the filled portions of the characters are black, so that high-quality character printing is achieved.

BRIEF DESCRIPTION OF THE DRAWINGS

FIGS. 1(a), 1(b) and 1(c) are process diagrams which illustrate a half-tone gravure character (the letter "A") prepared by the method of the present invention for forming plate characters in a half-tone gravure platemaking process, and which is then printed; and FIGS. 2(a), 2(b) and 2(c) are process diagrams which illustrate a half-tone gravure character (the letter "A") prepared by a prior art method for forming plate characters in a half-tone gravure platemaking process, and which is then printed.

DETAILED DESCRIPTION OF THE INVENTION

Below, a method for forming plate characters in a half-tone gravure platemaking process in accordance with the teachings of the present invention will be described in terms of the FIGS. 1(a), 1(b) and 1(c).

A direct platemaking method will be described in which a laser beam is moved so that it spot-irradiates a plate roll coated with a photosensitive film, thus forming character data as aggregations of beam dots resulting from laser beam exposure.

Specifically, in this method, a single laser beam is split by means of a beam splitter into approximately 20 beams, which are of equal intensity and which are arranged in a single row in the form of a connected chain. Laser exposure is effected while scanning is performed by irradiating the split laser beam, each beam passing through a multi-type light modulator (which is independently driven in accordance with the character data) and an auto-focus lens, onto the plate roll coated with the photosensitive film which constitutes the photosensitive material.

In a case where, for example, the letter "A" is inscribed on the plate roll via laser exposure, the multiple electrodes of the multi-type light modulator are driven so that (a) the outline portion of the character is continuously exposed, and (b) the filled portion of the character (i.e., the area inside the outline portion of the character) is exposed so that it is filled with dot-shaped cells corresponding to the dot percentage of the shadow portion.

The multi-type light modulator is driven as follows: Character data is supplied from a memory (in which the character data is stored) and converted into the necessary signals, which are distributed and supplied to the multiple electrodes. Furthermore, with regard to the character data stored in the memory, laid out character data is used along with image data in a layout scanner. In this layout scanner, an accessory program which can define picture element data separately for the character outline portion and the filled portion of the character is used for characters which are displayed in a graphic display. The character outline portion 1 of each character is defined as having a 100% shade gradation and a line width that is as narrow as possible without causing ink flow (running) when the cells are filled with ink and the plate surface is wiped by a doctor blade (e.g., a line width of 20 microns). The filled portion 2 of each character is defined as having a shade gradation corresponding to the dot percentage of the shadow portion (e.g., a shade gradation of 75%). This data is stored in the memory, so that a display of the type shown in FIG. 1(b) is obtained.

When a character thus defined by the layout scanner and stored in the memory is output by the laser exposure device, an inverted display of the type shown in FIG. 1(a) is used. Specifically, for each plate character, the character outline portion 1 is irradiated so that continuous laser beam lines with a groove width of 20 microns are formed, and the filled portion 2 of the character (i.e., the area inside the character outline portion) is irradiated in dot form so that screen lines remain corresponding to the dot percentage of the shadow portion.

When the plate roll which has been laser-exposed in this manner is developed/etched, plate characters are formed which are composed of screen points as shown in FIG. 1(a). In each of these plate characters, the character outline portion 1 is formed by continuous groove-shaped cells with a groove width of 30 microns and the filled portion 2 of the character (i.e., the area inside the character outline portion) is formed by dot-shaped cells corresponding to the dot percentage of the shadow portion of the character. Furthermore, the character outline portion 1 is formed so that its groove-shaped cells have as narrow a width as possible so that when the cells are filled with ink the ink will not flow (run) when the plate surface being is wiped with a doctor blade.

When ink is applied to such a plate character, the cells can be filled with ink as shown in FIG. 1(b). When transfer printing onto paper, etc., the ink is thick in the outline portion of the character, and the ink spreads (as in conventional processes) in the filled portion of the character (i.e., the area inside the outline portion) so that the areas of the blank paper corresponding to the screen lines disappear, thus producing a sharp black printed character as shown in FIG. 1(c) and without notches appearing in the outline portion of the character (letter "A").

The method of the present invention for forming plate characters in a half-tone gravure platemaking process can also be used in cases where the filled portion of the character consists of small plate characters which are too narrow to allow the filled portion to be filled with dot-shaped cells corresponding to the dot percentage of the shadow portion of the character involved. Instead, the filled portions are filled with island-shaped projections to such an extent that ink flow (running) is not caused when the cells are filled with ink as a result of the plate surface being wiped by a doctor blade.

Also, the method of the present invention can be used where the laser beam is moved so that it spot-irradiates a photosensitive film (silver salt film) wrapped around a drum so as to form character data as aggregations of beam dots by the laser exposure. Such a photosensitive film is then developed and wrapped around a plate roll which is coated with another photosensitive film, and the plate roll is then exposed and developed/etched, so that plate characters consisting of screen points are formed.

As described above, according to the method of the present invention, ink is thick in the outline portion of the character, so that the outline portion of the character is far sharper than in typeface printing. In addition, the filled portion of the character are black, so that high-quality character printing can be achieved.

What is claimed is:

1. A method for forming plate characters in a half-tone gravure platemaking process, characterized in that a laser beam of a laser exposure apparatus is moved so that said laser beam irradiates a photosensitive material in spots, thus forming plate characters on said photosensitive material, each plate character being formed so that:

an outline of each character is formed of continuous groove-shaped cells;

an area inside said outline of said character is formed of independent dot-shaped cells which correspond to a dot percentage of a shadow portion; and said groove-shaped cells of said outline portion of each character have as narrow a width as possible without causing ink flow when said groove-shaped cells are filled with ink as a result of a plate surface being wiped by a doctor blade.

2. A method for forming plate characters in a half-tone gravure platemaking process, characterized in that a laser beam of a laser exposure apparatus is moved so that said laser beam irradiates a photosensitive material in spots, thus forming plate characters on said photosensitive material, each plate character being formed so that:

an outline of each character is formed of continuous groove-shaped cells;

an area inside said outline of said character is formed of independent island-shaped cells to an extent that ink flow does not occur when said island-shaped cells are filled with ink as a result of the plate surface being wiped by a doctor blade and, said groove-shaped cells of said outline portion of each character have as narrow a width as possible without causing ink flow when said groove-shaped cells are filled with ink as a result of the plate surface being wiped by a doctor blade.

* * * * *